United States Patent [19]

Le Dinh et al.

[11] Patent Number: 4,589,083
[45] Date of Patent: May 13, 1986

[54] ADAPTIVE SINUSOIDAL INTERFERENCE FILTER

[75] Inventors: Chon T. Le Dinh, Brossard; André Leblanc, Laval, both of Canada

[73] Assignee: Centre de Recherche Industrielle du Quebec, Quebec, Canada

[21] Appl. No.: 744,654

[22] Filed: Jun. 14, 1985

Related U.S. Application Data

[63] Continuation of Ser. No. 430,700, Sep. 30, 1982, abandoned.

[51] Int. Cl.$^4$ .............................................. G06F 15/31
[52] U.S. Cl. ...................................... 364/724; 364/825
[58] Field of Search ................ 364/724, 825; 328/167; 333/166

[56] References Cited

U.S. PATENT DOCUMENTS

| | | | |
|---|---|---|---|
| 4,052,559 | 10/1977 | Paul et al. ............................ | 333/166 |
| 4,106,102 | 8/1978 | Desblache ........................... | 364/724 |
| 4,238,746 | 12/1980 | McCool et al. ..................... | 333/166 |
| 4,287,475 | 9/1981 | Eaton et al. ........................ | 328/167 |
| 4,344,150 | 8/1982 | McLaughlin ....................... | 364/724 |
| 4,349,916 | 9/1982 | Roeder ................................ | 328/167 |
| 4,429,309 | 1/1984 | Kipp .................................... | 328/167 |
| 4,441,090 | 3/1984 | Warren ............................... | 333/166 |

OTHER PUBLICATIONS

White, "An Adaptive Tunning Filter for Communications", *Conference: 1982 International Symposium on Circuits & Systems*, Rome, Italy, May 10-12, 1982, pp. 705-708.

*Primary Examiner*—David H. Malzahn
*Attorney, Agent, or Firm*—Oblon, Fisher, Spivak, McClelland & Maier

[57] ABSTRACT

The invention relates to an adaptive filtering system for cancelling one or more sinusoidal interference signal contained with a desired signal in an incoming signal. A phase-locked loop is used to track a sinusoidal interference frequency and to synthesize various synchronous in-phase/in-quadrature square wave signals. Each of these signals is weighted in accordance with variations in the amplitude and the phase of the sinusoidal interference signal and the weighted square wave signals are combined together with the incoming signal so as to deliver the desired signal substantially free from any sinusoidal interference signal. In the case of multiple correlated signals, the instant filtering system gives a steady state performance substantially better than that of the well known Widrow-Hoff adaptive notch filter.

6 Claims, 13 Drawing Figures

1- Sgn(.)DENOTE THE SIGN OF (.)
2- θ = 2πfot

1- Sgn(.) DENOTE THE SIGN OF (.)
2- θ = 2πfot ns application is a continuation, of application Ser. No. 430,700, filed Sept. 30, 1982, now abandoned.

ADAPTIVE SINUSOIDAL INTERFERENCE FILTER

This application is a continuation, of application Ser. No. 430,700, filed Sept. 30, 1982, now abandoned.

BACKGROUND OF INVENTION (a) Field of the Invention

The invention relates to adaptive noise filtering systems, and more particularly, concerns a system adapted to filter a sinusoidal and/or correlated interference signal mixed with a desired signal in an incoming signal. The instant system is especially effective when the interference signal to be removed is contained in the same frequency spectrum as the desired signal.

(b) Description of the Prior Art

Heretofore, various devices and systems have been proposed for the purpose of separating, enhancing or cancelling noise, intersymbol interference, echo or different signal frequencies from an incoming input signal. Those previous systems are exemplified by U.S. Pat. No. 4,052,559 of Paul et al and U.S. Pat. No. 4,238,746 of McCool et al which each teach the use of an adaptive transversal filter incorporating the weight vector which is governed by the Widrow-Hoff algorithm, the latter being a real time least mean square (LMS) approximation of the Weiner-Hoff filter. Such algorithm is described in "Adaptive Noise Cancelling: Principles and Applications" of Widrow et al, in proceedings IEEE, Volume 63, number 12, December 1975, pages 1692 to 1716. However, the Widrow-Hoff algorithm generally requires true linear multipliers which are expensive, on the one hand, and present a system degradation since there are non-ideal on the other hand. Elsewhere, in the intersymbol interference literature many algorithms, such as clipped data or clipped error have been proposed to partly avoid or to reduce the number of those linear multipliers.

Moreover, when the interference signal is merely a sinusoidal waveform, Widrow suggested to use rather a pair of in-phase/in-quadrature signals instead of adaptive transversal filters to track the amplitude and the phase of the sinusoidal interference signals while assuming that the frequency thereof is already known. Even in those cases, several linear multipliers are required to implement the adaptive algorithms.

SUMMARY OF THE INVENTION

It is a general feature of the present invention to provide an adaptive filtering system effective in removing sinusoidal interference signals comprised in an incoming signal without the use of linear multipliers.

Another feature of the present invention resides in providing an adaptive filtering system capable of tracking variations of the interference parameters which are not previously known.

A further feature of the present invention is to provide an adaptive filter which can enhance a narrow band spectral line in a broadband noise field.

Accordingly, the invention is generally directed to an adaptive filtering system for filtering a sinusoidal interference signal contained with a desired signal in an incoming signal. The system comprises means for frequency tracking the interference signal in the incoming signal and for generating in synchronism various pairs of square wave signals in phase-quadrature relationship. Means are provided for weighting each of the square wave signals in accordance with variations in amplitude and phase of the sinusoidal interference signal without any linear multipliers. Means are also provided for filtering the combined weighted square wave signals for subtracting same from the incoming signal so as to deliver the desired signal substantially free from the sinusoidal interference signal.

Preferred embodiments of the present invention generally reside in that the square wave signal generating means generates pairs of square wave signals in phase-quadrature, and wherein each signal of each pair of square wave signals is properly and individually weighted by the weighting means and all of the square wave signals are fed to the signal combining means.

A further embodiment of the present invention generally provides a plurality of filtering systems interconnected either in series or in parallel so as to cancel a plurality of interference signals mixed with a desired signal in an incoming signal, each filtering system being effective in removing a given interference signal from the incoming signal.

BRIEF DESCRIPTION OF DRAWINGS

A preferred embodiment of the present invention will be hereinafter described with reference to the examples illustrated by the accompanying drawings, in which.

DESCRIPTION OF PREFERRED EMBODIMENTS

Figure 1:
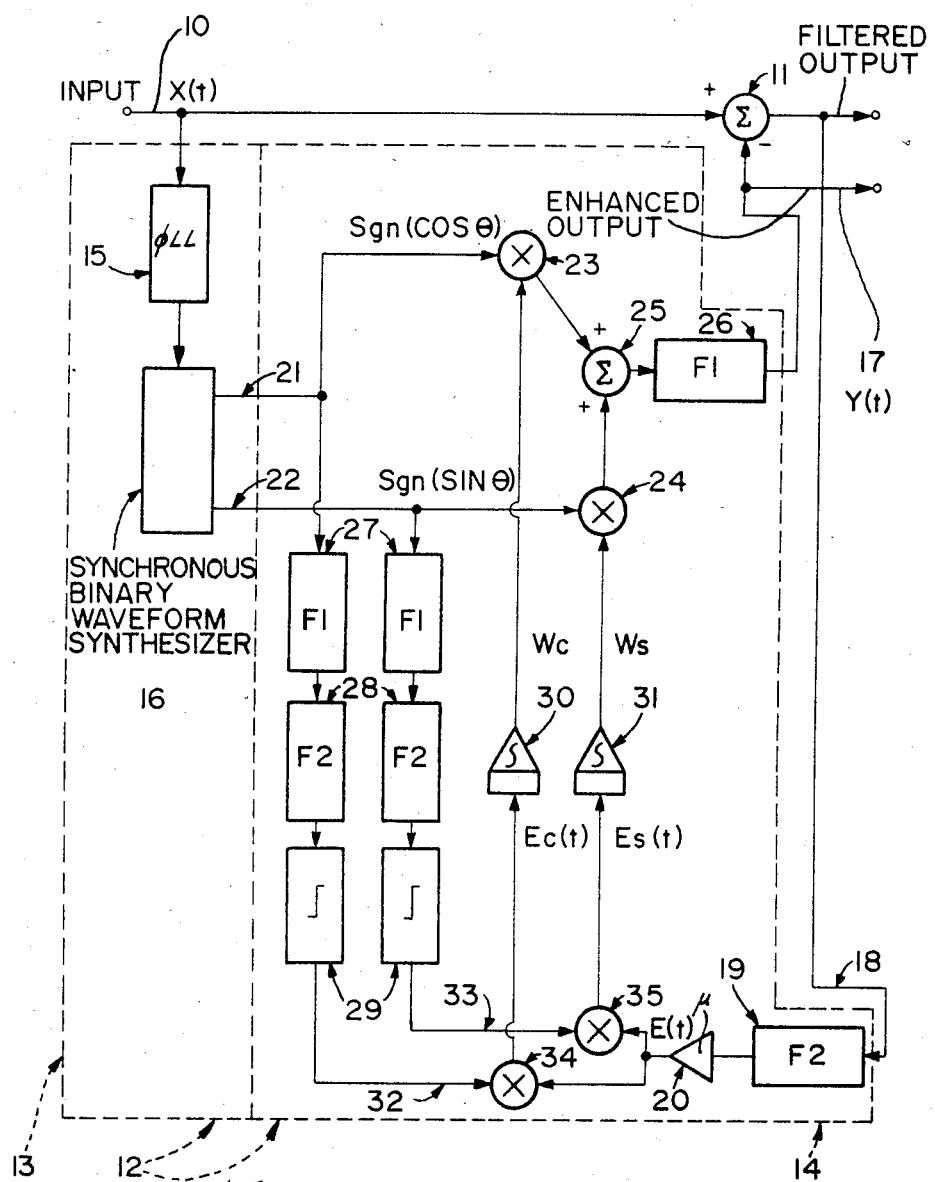
FIG. 1 is a block diagram of the basic adaptive sinusoidal interference filtering system (ASIF) according to the present invention.

Referring to FIG. 1, there are illustrated schematically the various circuit elements comprised in the adaptive sinusoidal interference filtering system (ASIF). Firstly, it is assumed that the incoming input signal X(t) comprises a single sinusoidal interference signal mixed with a desired signal and further the frequency, phase and amplitude of the sinusoidal interference signal are not accurately known or are slowly varying with time. That incoming signal X(t) is simultaneously fed to both a combining or adding circuit 11 and to an adaptive filtering circuit arrangement 12. For sake of clarity of the present arrangement, the filtering is shown divided into two main circuits constituted by a square wave signal forming circuit 13 and a weight determining circuit 14. Circuit 13 generally operates to track the frequency of the sinusoidal interference signal and to generate two synchronous square wave signals characterised in a phase/quadrature relationship. In addition, all timing signals required by the filtering system are supplied by circuit 13. The square wave signal forming circuit 13 includes a phase lock-loop circuit 15 connected to a binary waveform synthesizer 16. The phase lock-loop 15 mainly serves to track and to multiply the fundamental frequency fo of the interference signal. In order to simplify the design of the synthesizer 16 which delivers the two synchronous square wave signals in phase/quadrature through the output lines 21, 22, the multiplication factor of the loop circuit 15 is being selected as a multiple of 4. The synthesizer 16 may be built using conventional integrated circuit logic.

It is to be noted that when X(t) contains a single interference frequency, the capture range and the tracking range of the phase lock-loop circuit 15 has then to be sufficiently broad to cover the entire range of variations of the fundamental frequency fo of the interference signal. Conversely, when X(t) includes several interference frequencies, the capture range and the tracking range have to be sufficiently narrow in order to assure a suitable resolution. In the latter case, it is useful to provide means to sweep the frequency of the voltage control oscillator (not shown) incorporated in circuit 15.

Turning to the weight determining circuit 14, the function thereof resides in tracking the amplitude and phase variations of the interference signal. In this respect, the signal Y(t) appearing at the output 17 is a faithful reproduction of the interference signal and the latter reproduced signal is conveyed to the combining circuit 11 so as to cancel the interference signal. On the other hand, the filtered output desired signal delivered by the combining circuit 11 is fed back to circuit 14 through line 18 to the input of a F2 type filter 19 which is centered on the interference signal frequency fo so as to remove from the input signal all freuency components other than fo. It is to be noted that filter 19 substantially enhances the performance of the filtering system whenever the incoming signal X(t) incorporates correlated signals other than fo.

The output of filter 19 feeds an amplifier 20 which controls the bandwidth of the adaptive filter. In the particular case where integrators 30 and 31 are implemented digitally rising the Widrow-Hoff, LMS, algorithm, the gain of amplifier 20 has to remain sufficiently small in order to assume system convergence.

On the other hand, the weight determining circuit 14 is supplied with the two binary signals in phase/quadrature sgn (cos 2πfot) and sgn (sin 2πfot) through lines 21 and 22, respectively. These signals 21 and 22 are then multiplied by the weight factors $W_c$ and $W_s$ provided from the integrators 30 and 31, respectively through the multipliers 23 and 24. The signals 21 and 22 are square wave signals. The multipliers 23 and 24 may be constituted by switches whenever the weight signals $W_c$ and $W_s$ are analog signals, or by exclusive OR gates when $W_c$ and $W_s$ are digital signals. The output of the two multipliers 23 and 24 are added into the combining circuit 25 which then delivers the following signal:

$$W_c \text{ sgn } (\cos 2\pi fot) + W_s \text{ sgn } (\sin 2\pi fot) \quad (1)$$

The Fourier series expansion of the above expression includes all odd harmonics due to the square waveform of signals 21 and 22. Therefore, a filter F1, 26 is connected to the output of the combining circuit 25 so as to eliminate the undesired harmonics.

In order to define the weight values of $W_c$ and $W_s$, the square wave signals 21 and 22 are individually fed to the series connected F1 type filters 27 and F2 type filters 28, the outputs of which are linked to the limiting circuits 29. The functions and choice of filters 27 and 28 will be explained later with reference to FIGS. 2 and 3. As to the limiting circuit 29, they ensure the delivery of square waves through the output 32 and 33. These square wave signals 32 and 33 are multiplied with the feedback signal e(t) supplied by the amplifier 20 through the multipliers 34 and 35 which output signals $e_c(t)$ and $e_s(t)$ applied to the inputs of the integrators 30 and 31 to produce the output weight signals $W_c$ and $W_s$.

It is noted that the value of the weight signals $W_c$ and $W_s$ vary in conformity with the changes in the amplitude and phase of the sinusoidal interference signals appearing at the input due to the correlation between the feedback signal 18 and the two square wave signals which are suitably delayed through filters 27 and 28. Thus, when the amplitude and the phase of the interference signal slowly vary, weight values $W_c$ and $W_s$ readily track these changes.

The circuit configuration proposed in FIG. 1, particularly of the weight determining circuit 14, is derived from the Widrow-Hoff algorithm while assuming that the weight values $W_c$ and $W_s$ vary slowly. However, the above configuration does not include any linear multiplier and this because of the use of the F1 and F2 filters, the choice and function of which will now be explained.

Figure 2A:
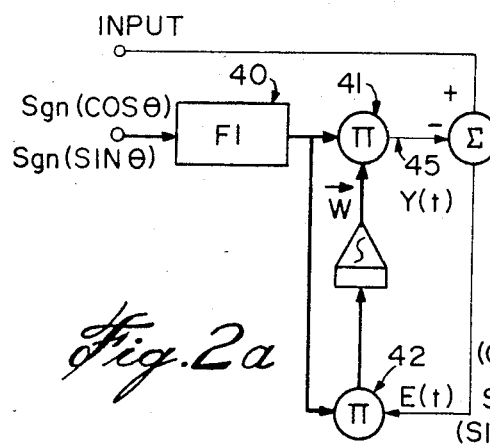
FIGS. 2a to 2d are schematic diagrams showing the uses of F1 type filters and switch multipliers in the filtering system of FIG. 1.

Referring to FIGS. 2a through 2d, the function of filters F1 as well as of the switch multipliers is explained in relation to the actual design of the filtering system. FIG. 2a illustrates the Widrow-Hoff algorithm when the binary signals sgn (cos 2πfot) and sgn (sin 2πfot) are valid. The input F1 filters 40 serve to remove the harmonic frequencies from each signal so that the outputs of the filters 40 are quasi-sinusoidal; consequently, linear multipliers 41 and 42 are required.

Figure 2B:
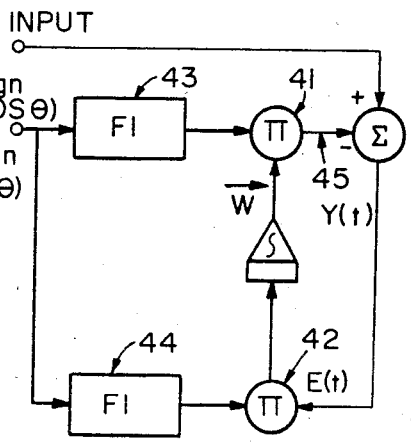
Figure 2C:
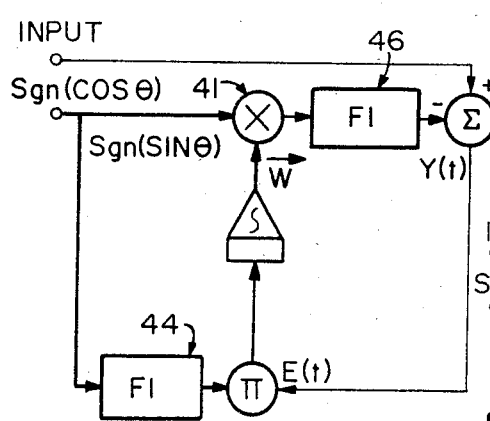

FIG. 2b shows an arrangement equivalent to that of FIG. 2a and wherein F1 filters 43 and 44 have been implemented. In this case, when the weights W vary slowly, the F1 filters 43 may be inserted after the multipliers 41 and thus be combined into a single filter 16 as shown in FIG. 2c.

Signal Y(t) at point 45 in FIGS. 2a and 2b, may be written as follows:

$$Y(t) = W_c[fl(t)*sgn(\cos 2\pi fot)] + W_s[fl(t)*sgn(\sin 2\pi fot)]$$

$$y(t) = [fl(t)*W_c sgn(\cos 2\pi fot)] + [fl(t)*W_s sgn(\sin 2\pi fot)]$$

$$y(t) \approx fl(t)*[W_c sgn(\cos 2\pi fot) + W_s sgn(\sin 2\pi fot)]$$

where the notation * means convolution and, fl(t) indicates the impulse response of the F1 filter. The linear multipliers 41 of FIGS. 2a and 2b may therefore be replaced by the simple switch multipliers 41 shown in FIGS. 2c and 2d.

Figure 2D:
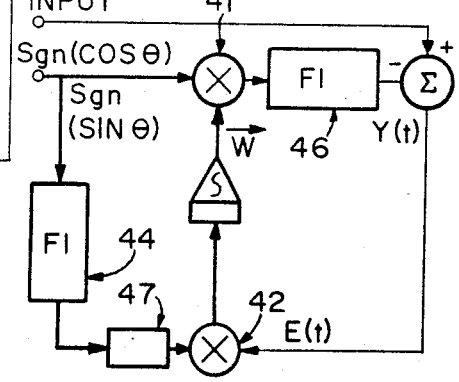

In addition, FIG. 2d illustrates the implementation of the limiters 47 at the outputs of the F1 filters 44. It is obvious that the use of these limiters 47 is rendered possible when the signal e(t) does not contain correlated harmonics of the sinusoidal interference signal.

Such an assumption is justified if an appropriate F2 filter is inserted into the feedback path. The limiters 47 allow the replacement of the linear multipliers 42 of the FIG. 2a by the less expensive switch multipliers 42 of FIG. 2d.

As stated previously, the F2 filter 19 included in the feedback path of FIG. 1 has been introduced for the purpose of eliminating as much as possible all signals other than the sinusoidal interference signal. The function of the filter F2 will now be explained with reference to FIGS. 3a through 3e.

Figure 3A:
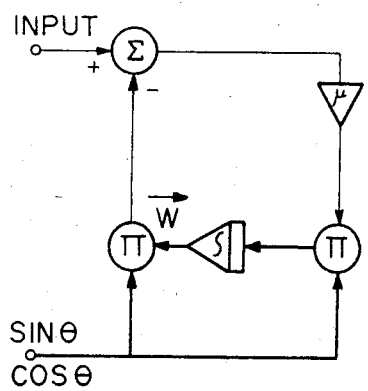
FIGS. 3a to 3e are schematic diagrams showing the uses of F2 type filters in the filtering system of FIG. 1.
Figure 3B:
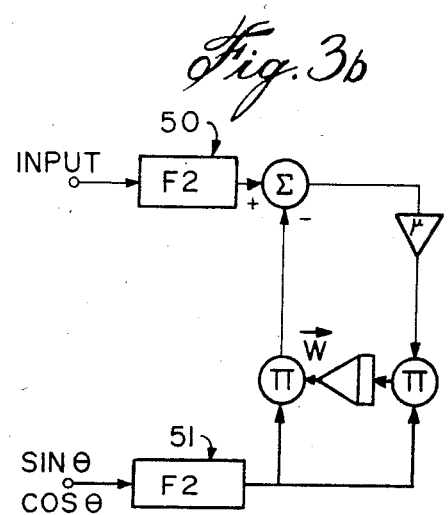

FIG. 3a shows an arrangement also based on the Widrow-Hoff algorithm. By the addition of F2 filter 50 shown in FIG. 3b at the input and the two F2 filters 51, in each reference sin (2πfot) and cos (2πfot) in FIG. 3b, becomes the equivalent of FIG. 3a as far as interference tracking is concerned.

Figure 3C:
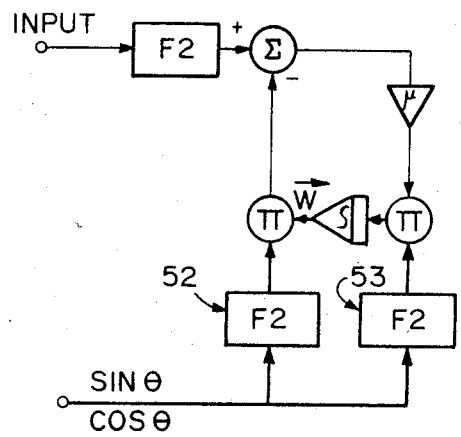
Figure 3D:
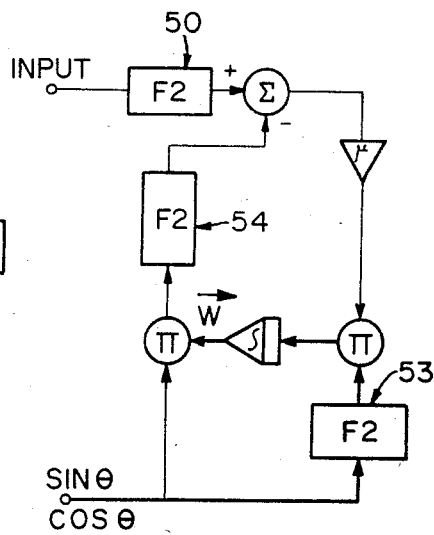

Of course, the two filters 51 may be replaced by two identical pairs of filters 52 as it is shown in FIG. 3c. Therefore, when the weight values W vary slowly, the filters 52 may be replaced by a single F2 filter 54 of FIG. 3d. Additionally, the F2 filters 50 and 54 may be grouped into a single F2 filter 55 shown in FIG. 3e.

Figure 3E:
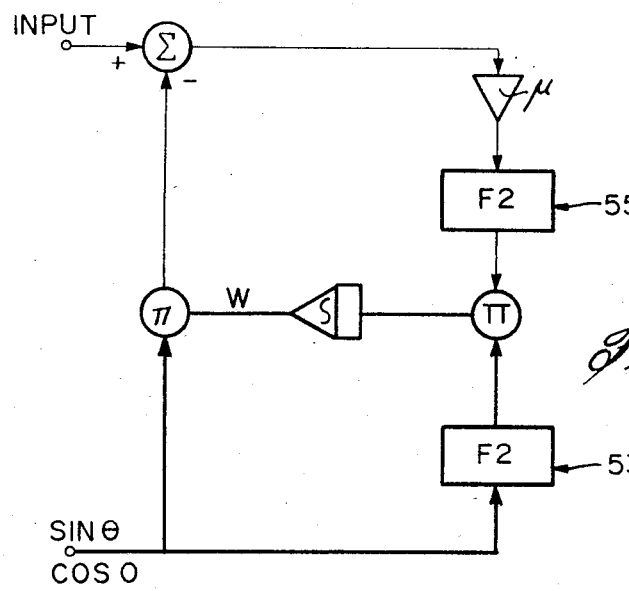

Finally, by combining the arrangements of FIGS. 2d and 3e, the configuration of the weight determining circuit 14 of FIG. 1 is achieved.

Figure 4:
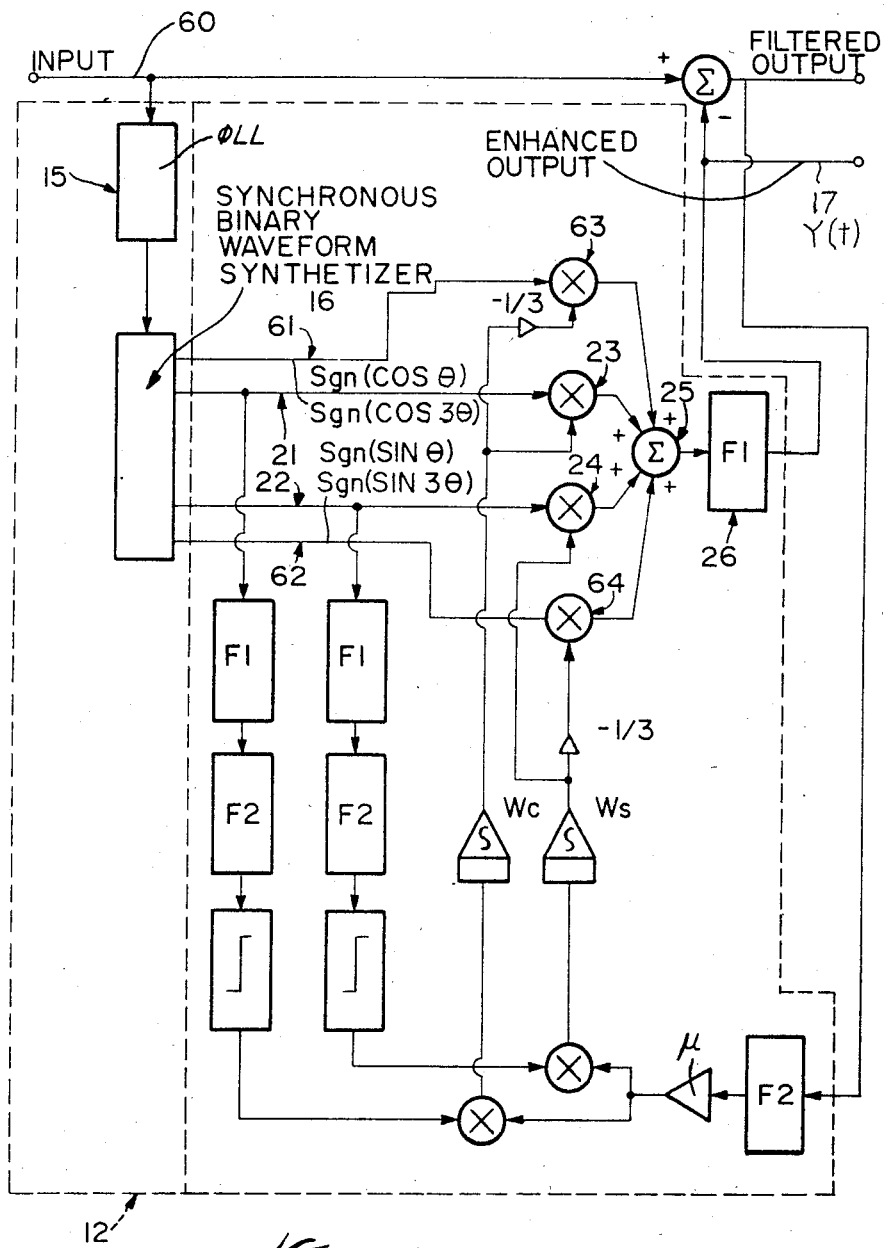
FIG. 4 is a schematic diagram illustrating another embodiment of the invention wherein harmonic signals are removed for the enhanced interference signal output.

Turning now to FIG. 4, there is illustrated another embodiment of the present invention. When the range of variations of the interference signal frequency fo is large, the F1 filter 26 cannot attenuate sufficiently the harmonics of the binary signals 21 and 22. It is therefore possible to reduce the requirements in the F1 filters through the cancellation of the harmonics indicated in the following expressions:

$(4/\pi) \sin \theta = sgn(\sin \theta) - (\frac{1}{3})sgn(\sin 3\theta) - (1/5)sgn(\sin 5\theta) - \ldots$ $(4/\pi) \cos \theta = sgn(\cos \theta) - (\frac{1}{3})sgn(\cos 3\theta) - (1/5)sgn(\cos 5\theta) - \ldots$ where $\theta = 2\pi fot$.

As shown in FIG. 4, in addition to the binary signals 21 and 22 the synchronous binary waveform synthesizer 16 supplies two other binary signals, namely sgn (cos 2π3fot) and sgn (sin 2π3fot) respectively referred to as 61 and 62. These latter signals are multiplied by the weight values $-(\frac{1}{3}) W_c$ and $-(\frac{1}{3}) W_s$, respectively through the switch multipliers 63 and 64. The outputs of the four multipliers 23, 63, 24 and 64 are added by means of the combined circuit 25 and the resulting signal is free from third harmonic frequency.

Obviously, any additional cancellation of higher order harmonics may be achieved in the same fashion through the use of the suitable weighting factors.

Figure 5A:
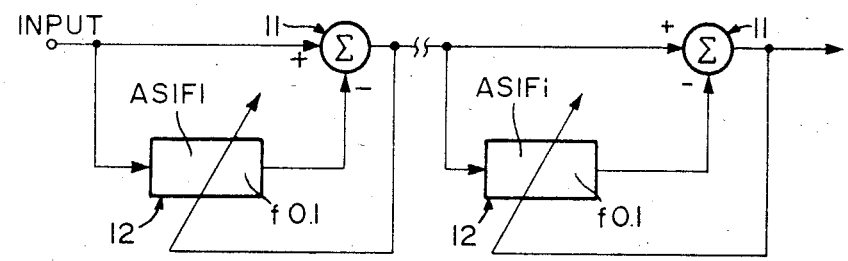
FIGS. 5a and 5b are schematic diagrams showing respectively several adaptive interference filtering systems interconnected either in series or in paralled for cancelling a plurality of intereference signals present in an incoming signal.
Figure 5B:
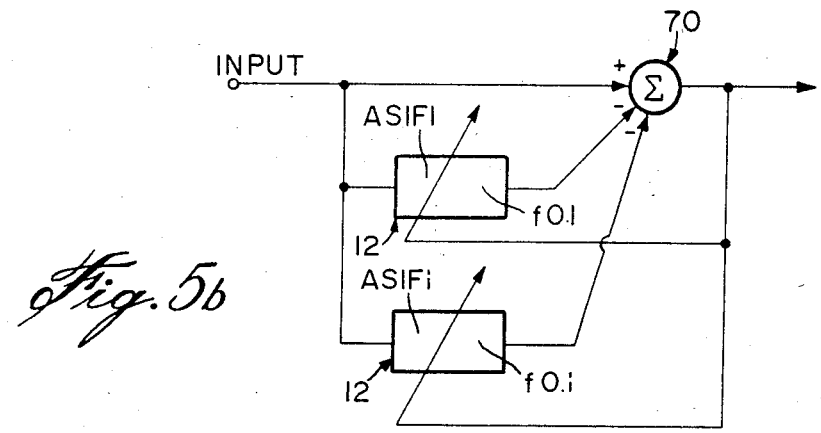

FIGS. 5a and 5b show adaptive filters connected either in series or in parallel for the cancellation of more than one sinusoidal interference signal from an incoming signal. In this case, each adaptive filter operates to eliminate one specific interference signal among a plurality of such signals. It is to be noted that in the parallel configuration, only one single combiner 70 is required. Also, in the parallel configuration, care should be exercised to avoid any overlap in the respective frequency ranges of the various interference signals.

We claim:

1. An adaptive filtering system for filtering a sinusoidal interference signal contained within the useful bandwidth of a desired wide-band signal, said system comprising:

an input terminal and an output terminal;
   means for phase-tracking the interfering signal contained within the wide-band signal by the use of a phase-lock loop circuit including an oscillator, said means being connected to said input terminal of said system;
   means for generating two synchronous square wave signals in phase quadrature, synchronous with said interfering signal, said means for generating two synchronous square wave signals being driven by said oscillator in said phase-lock loop circuit;
   means for filtering and limiting the said two synchronous square wave signals;
   means for generating two weighted signals including filter means connected to said output terminal, two multipliers connected to said filter means and said means for filtering and limiting, and two intergrators connected to said two multipliers to produce said two weighted signals
   weighting second multiplier means coupled to said two integrators and said means for generating two synchronous square wave signals for generating two weighted square wave signals;
   mixing means for combining said weighted square wave signals for producing a combined weighted signal;
   an output filter connected to said mixing means to produce a signal which is an estimate of the interference in said input signal;
   an output combiner connected to said input terminal and said output filter for receiving said estimate signal to cancel the interfering signal in said input signal and produce an output signal substantially free of sinusoidal interference at said output terminal.

2. A filtering system as claimed in claim 1, wherein said phased-lock loop circuit includes means for multiplying the fundamental frequency of said interference signal.

3. A filtering system as claimed in claim 2, wherein said multiplying means said phase lock loop circuit has a multiplication factor which is a multiple of four.

4. A filtering system as claimed in claim 1, wherein said mixing means includes switch multipliers.

5. A filtering system as claimed in claim 1, wherein said mixing means includes exclusive OR gates.

6. A filtering system as claimed in claim 1, wherein said means for generating square wave signals is comprised of a generator having two pairs of output square wave signals in phase-quadrature at odd multiples of the interference frequency, each signal of each pair of said square wave signals being connected to said weighting second multiplier means.

* * * * *